US008558269B2

(12) United States Patent
Chen

(10) Patent No.: US 8,558,269 B2
(45) Date of Patent: Oct. 15, 2013

(54) LIGHT EMITTING DIODE

(76) Inventor: Wen-Pin Chen, Taipei County (TW)

(*) Notice: Subject to any disclaimer, the term of this patent is extended or adjusted under 35 U.S.C. 154(b) by 204 days.

(21) Appl. No.: 13/006,550

(22) Filed: Jan. 14, 2011

(65) Prior Publication Data

US 2011/0169044 A1 Jul. 14, 2011

(30) Foreign Application Priority Data

Jan. 14, 2010 (TW) .............................. 99100976 A

(51) Int. Cl.
*H01L 33/38* (2010.01)

(52) U.S. Cl.
USPC .............. 257/99; 257/E33.001; 257/E33.065

(58) Field of Classification Search
USPC .............................. 257/99, E33.001, E33.065
See application file for complete search history.

(56) References Cited

U.S. PATENT DOCUMENTS

| 3,936,322 A * | 2/1976 | Blum et al. ..................... 438/45 |
| 8,288,786 B2 * | 10/2012 | Hwang et al. .................. 257/98 |
| 2009/0242929 A1 * | 10/2009 | Lin ............................... 257/103 |

* cited by examiner

*Primary Examiner* — Long Pham
(74) *Attorney, Agent, or Firm* — McClure, Qualey & Rodack, LLP

(57) ABSTRACT

A light-emitting diode has a metal mesh pattern formed on an active layer without a transparent oxide conductive layer formed in between is disclosed. The mesh pattern is formed by using ion bombardment a metal layer so that myriad pits formed into the exposed portion of the active layer served as light emitting centers.

6 Claims, 4 Drawing Sheets

LIGHT EMITTING DIODE

FIELD OF INVENTION

This invention relates to a light-emitting semiconductor device having enhanced brightness, particularly to a high power light emitting diode using a metal mesh directly onto the upper cladding layer of the active layer instead of on a transparent oxide layer.

BACKGROUND

The principles lying behind luminance of light emitting diodes relate to injecting an electric current sequentially through P-N junctions of a semiconductor to generate light, wherein AlGaInP is implemented in high brightness red, orange, yellow and yellowish green LEDs, AlGaInN is in blue and green LEDs. The process of metal organic vapor phase epitaxy (MOVPE) is commonly adopted in the mass production of the LEDs, while the light-emitting components are of the structures, including: homo-junction (HOMO), single-heterostructure (SH), double-heterostructure (DH), single-quantum well (SQW) and multiple-quantum well (MQW) or other appropriate structures.

The structure of a conventional light emitting diode is illustrated in FIG. 1A, including, from the top down, a front electrical electrode, a transparent oxide layer or a window layer 14 to disperse the current, an active layer 12, a substrate 10 and a back contact 13. Among them, the active layer 12 is formed by a light-emitting material, such as AlGaInP or AlGaInN by adopting MOVPE and the transparent conductive oxide layer is a transparent conductive oxide layer typically formed of an indium tin oxide (ITO) layer. After a current is injected through the front contact 11, the current will pass through the transparent conductive oxide layer 14 to disperse and then through the active layer 12 and the substrate 10 to flow towards the back contact 13. Light is emitted when the current flows through the active layer 12. The active layer 12 is a sandwich layer, including a p-type upper cladding layer, an intrinsic layer and an n-type lower cladding layer. However, the low carrier mobility and high resistance of the active layer made of AlGaInP or AlGaInN results in poor electric conductivity of the AlGaInP or AlGaInN. Apart from that, the transparent conductive oxide layer 14 though can improve the current dispersion, its conductive ability is however weaker than a metal layer. Consequently, a metal grid layer 16 is generally embedded in the ITO layer 14, e.g., a metal grid layer formed on the active layer, and then covered it by forming an ITO layer thereover. The current distribution is getting improvement, never less, the primary emitting regions are mainly concentrated at and next to the lower portion of the electrode, as shown in FIG. 1A.

To enhance the current distribution, improvements have been made to the structures and materials, such as that disclosed in U.S. Pat. No. 5,008,718 by Fletcher et al., where a capping layer 15 (or window layer), made of GaP, GaAsP and AlGaAs having a low resistance value and being pervious to light, is added between the front contact and active layer, as shown in FIG. 1B. The objective of using this capping layer is to enhance the current distribution flowing from the front contact. As described in the '718 patent, to improve the current distribution, the capping layer is preferred to be in the range from 150 to 200 micrometers thick to enhance the luminous intensity by 5 to 10 times. However, the increasing thickness of the capping layer also increases the time and cost required for MOVPE epitaxy thereby significantly increasing the cost of the epitaxy. In addition, the distribution ability is extremely relevant to the thickness. Hence, to ensure even current distribution, the thickness must be at least 10 micrometers or the current crowding problem cannot be effectively resolved.

Another embodiment is to change the design of the electrode. The structure metal electrode is a mesh. Please refer to FIG. 1C; a substrate 100 thereover is formed with an active layer, which may be a double hetero junction or a quantum well to improve the emitting efficacy. A transparent layer such as GaP, AlgaAs or an ITO layer 140 is then formed on the active layer to improve the current distribution. The back electrode 130 is formed on the opposite face of the substrate 100. On the other hand, an upper electrode 210, which is a metal mesh formed on the transparent layer 140 and an extra metal pad 110 is formed on the metal mesh 210.

The material of the substrate 100 is dependent on the material of the active layer 120. When the active layer 120 is made of AlGaInP, GaAs is chosen as the substrate. When the active layer 120 is made of AlGaInN. Any of sapphire, may be selected as the substrate. The active layer is preferred to be in the range from 0.3 to 3 μm in thick. The thickness of the transparent layer 140 is preferred to be in the range from 10 to 50 μm. Both the active layer 120 and the transparent layer 140 are formed by MOVPE or molecular beam epitaxy (MBE).

The metallic mesh layer 210 suggested are dimensioned to 0.5 to 5 micrometers and evenly distributed above the substrate. If the meshes are dimensioned to 2 μm with a capping layer having a thickness of 15 μm, the light-emitting angle θ is calculated by, $\tan s2\theta_c = 2/15 \rightarrow 2\theta_c \approx 7.6° \rightarrow \theta_c \approx 3.8°$.

SUMMARY OF INVENTION

It is a primary objective of this invention to provide a light-emitting diode to save the cost.

It is another object of the present invention is to improve the injecting current distribution and less light be shadowed by the metal mesh line.

The present invention discloses a light-emitting diode having a metal mesh pattern formed directly on an active layer without a transparent oxide conductive layer formed in between to save the manufacture cost. The mesh pattern is formed by using ion bombardment a metal layer so that myriad pits formed into the exposed portion of the active layer served as light emitting centers.

BRIEF DESCRIPTION OF THE DRAWINGS

These and other modifications and advantages will become even more apparent from the following detained description of preferred embodiments of the invention and from the drawings in which.

DETAILED DESCRIPTION OF THE INVENTION

Preferred Embodiments

According to a preferred embodiment, the light emitting diode has a metal meshes directly formed on the active layer without a transparent layer there between and in the openings of the meshes has myriad pits formed therein to service as emitting centers.

Figure 1A:
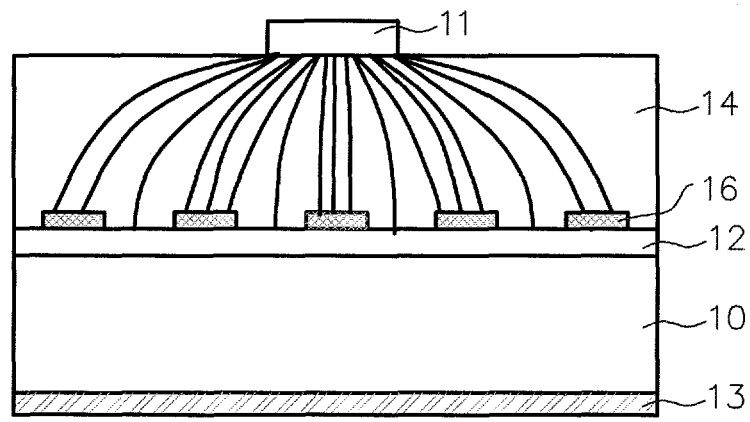
FIG. 1A is a cross-sectional view of a conventional light emitting diode structure having an ITO as transparent conductive oxide layer and metal grid layer embedded therein.
Figure 1B:
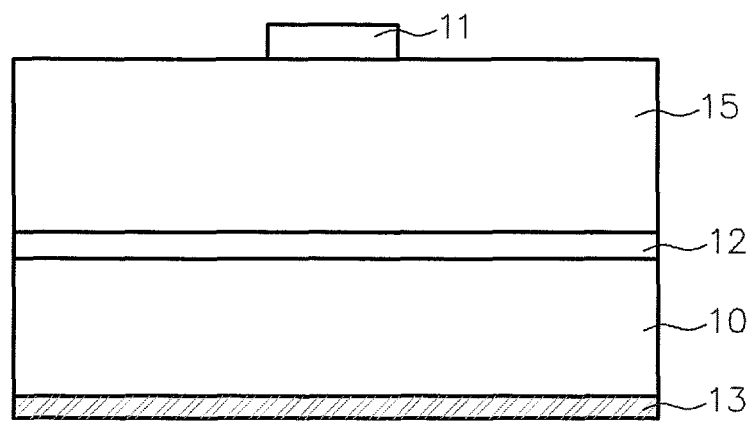
FIG. 1B is a cross-sectional view of a conventional light emitting diode structure having a transparent window layer selected from GaP, GaAsP, or AlGaAs for current redistribution.
Figure 1C:
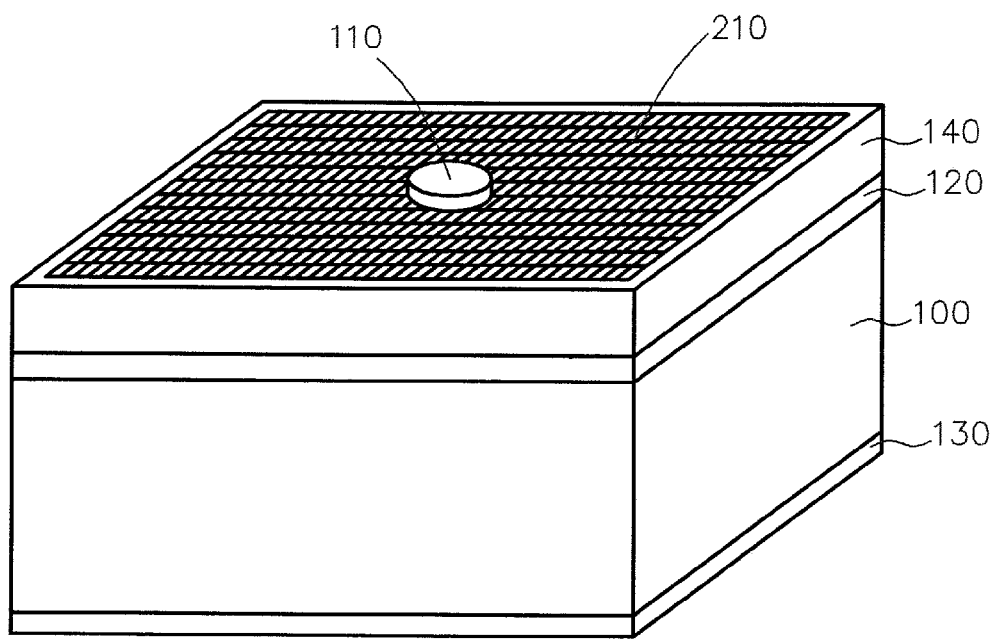
FIG. 1C is a cross-sectional view of a conventional light emitting diode structure having a metal mesh pattern formed thereon a transparent oxide layer formed thereunder.
Figure 2A:
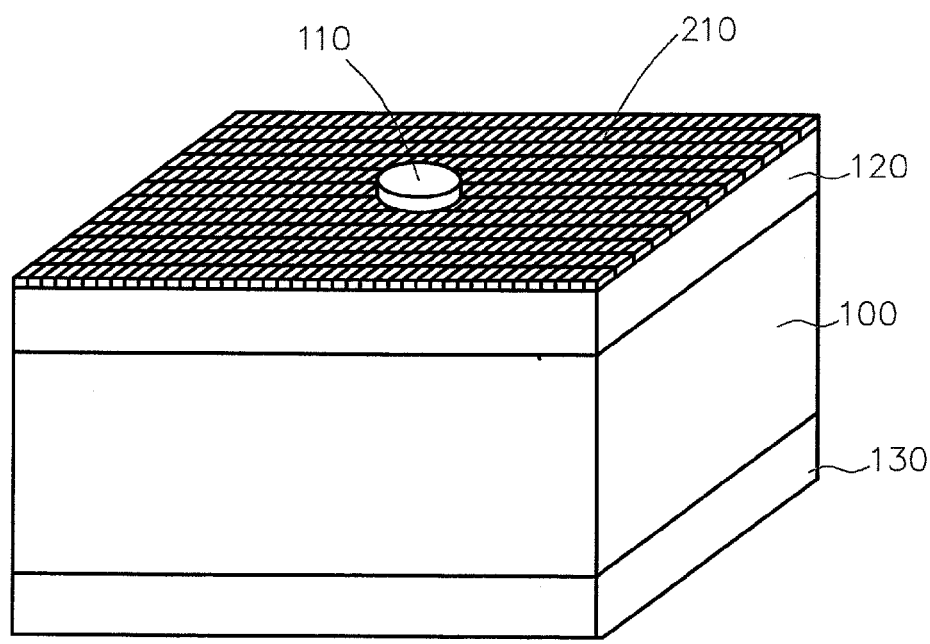
FIG. 2A is a cross-sectional view of a light emitting diode structure having a metal mesh pattern formed. Directly on an active layer without an ITO layer or a transparent window layer.

Referring to FIG. 2A, it is a cross-sectional view of a light emitting diode. First, an active layer 120 is formed on a substrate 100. The active layer is the primary structure of the LED component that may be a single-heterostructure, double-heterostructure, single-quantum well or multiple-quantum well to improve the emitting efficacy. When the active layer 120 is made of AlGaInP, GaAs is selected to form the substrate. When the active layer 120 is made of AlGaInN, a sapphire is selected as the substrate 100. The active layer is preferred to be in the range from 0.3 to 3 micrometers thick. The active layer 120 is formed by adopting MOVPE or molecular beam epitaxy (MBE).

Figure 2B:
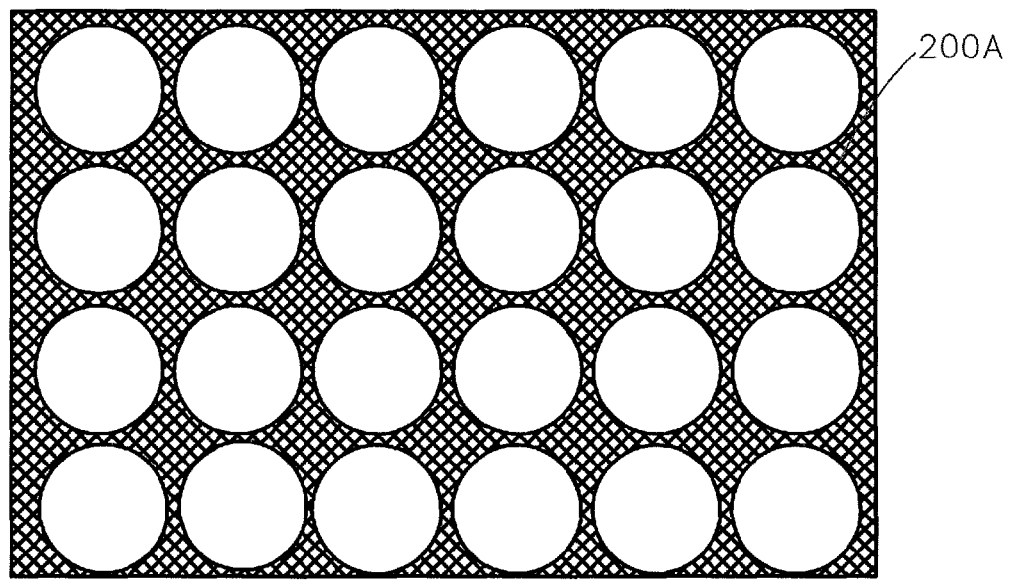
FIG. 2B is a top view of a metal mesh having a round-hole pattern.
Figure 2C:
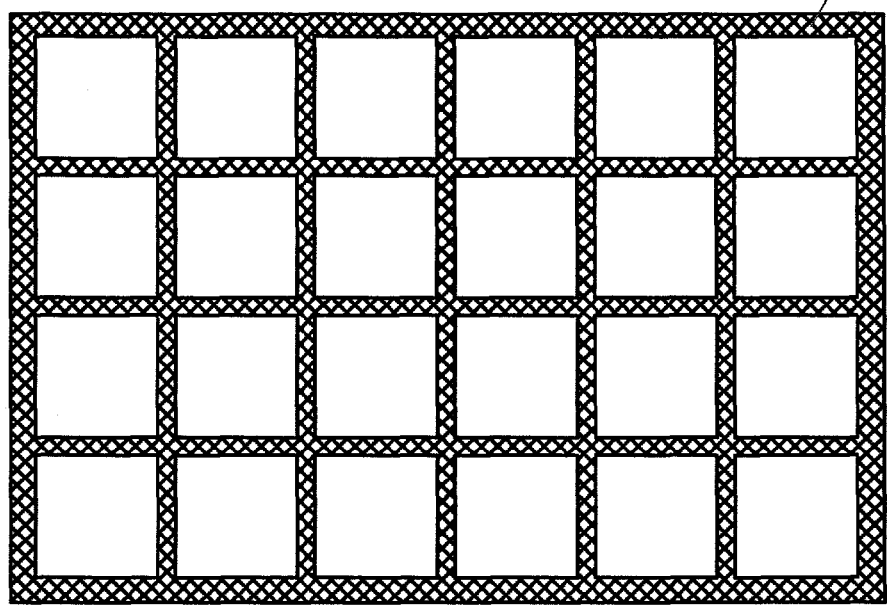
FIG. 2C is a top view of a metal mesh having a lattice-hole pattern.
Figure 2D:
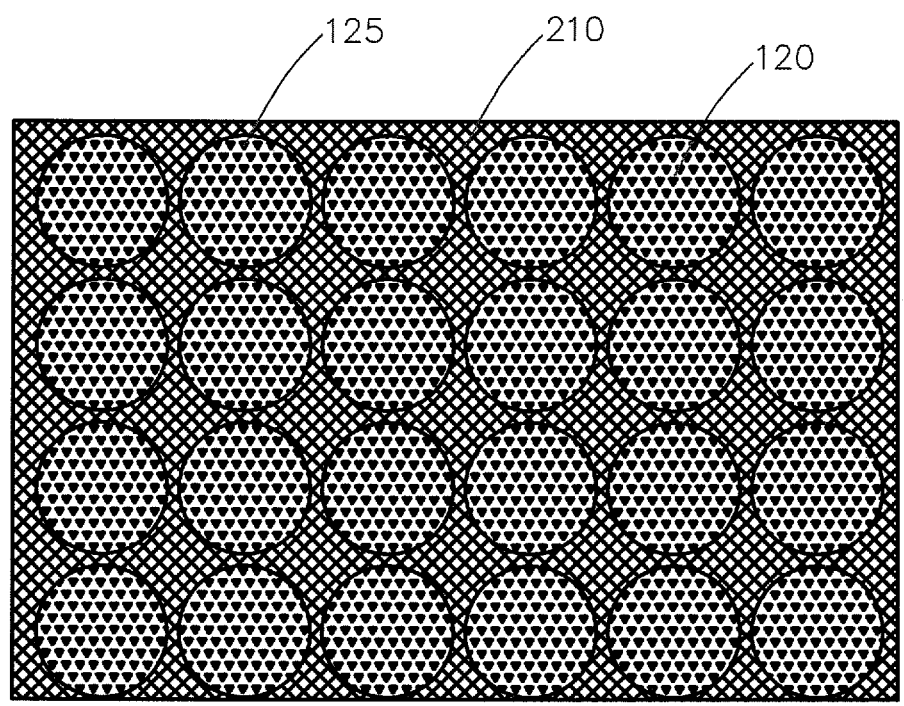
FIG. 2D shows myriad pits 125 formed into the active layer.

In accordance with a preferred embodiment, a metal layer is directly formed on the active layer 120 without a transparent layer 140 in between. The metal layer has a thickness between about 10~100 nm. A photoresist pattern having round holes or mesh pattern is formed on the metal layer as an etching mask. The coverage of the photoresist layer is about 20% to 30%. Thereafter, a dry etching such as an ion bombardment technique is carried out to etch the metal layer so as to generate a mesh pattern 210 having round holes 200A or lattice holes, as shown in FIG. 2B and FIG. 2C, respectively. The ion bombardment may use argon gas as plasma source. The photoresist pattern is then stripped off. The result surface of the active layer 120 becomes rough, particularly to those of exposed portions from the metal mesh pattern, as shown in FIG. 2D. That is myriad pits 125 acts as current centers or light emitter centers with sizes between nanometers or micrometers are formed on the exposed active layer 120 so that the main light emits will smooth out without shadow.

In another preferred embodiment, an ion beam etching technique is performed to pattern the metal layer by using a reticle having rounded holes or a mesh pattern as the etching mask. The rounded holes in the mesh have a diameter between about 1 μm to hundreds μm. In case of lattice holes in the mesh layer 210, the width of the mesh line is between 100 nm to 5000 nm so that the remnant metal with an area-coverage is between about 20-26%.

The material of the metal mesh layer 210 is selected from copper or silver. The conductivity of the Cu and Ag are, respectively, of about $6.3 \times 10^7$ s/m (or $1.728 \times 10^{-8}$ Ωm in resistivity) and $5.85 \times 10^7$ s/m in SI unit in compare with the $10^4$ s/m for ITO. For a case of metal area-coverage 25%, the transparency would be 75%. The transparency of the ITO is of about 80% for blue light or red light. Thus the total light emitting out from the metal mash layer is anticipated better than out from the ITO layer since the conductivity of metal mesh pattern is significantly surpass than that of the ITO.

The benefits of the present invention are:

1. The metal mesh pattern is directly formed on the active layer. No widow layer such as an ITO, GaP, GaAsP or AlGaAs layer is demanded. It is thus save the cost and time.

2. The metal mash layer is patterned by ion bombardment, myriad pits and become current centers are resulted and formed on the active layer where the centers are at the openings of the mesh pattern.

3. The current injection is directly through the metal mesh lines. It is thus the current distribution is uniform.

This invention is related to a novel creation that makes a breakthrough in the art. Aforementioned explanations, however, are directed to the description of preferred embodiments according to this invention. Since this invention is not limited to the specific details described in connection with the preferred embodiments, changes and implementations to certain features of the preferred embodiments without altering the overall basic function of the invention are contemplated within the scope of the appended claims.

What is claimed is:

1. A method of forming a light-emitting diode, comprising:
providing a semi-product of a light-emitting diode from a bottom thereof formed with an active layer, said active layer having a lower cladding layer, an intrinsic layer and an upper cladding layer;
forming a metal layer on said upper cladding layer;
patterning said metal layer by using a mask and an ion bombardment technique so as to form a mesh pattern having myriad pits into the exposed surface of said upper cladding layer from said mesh pattern.

2. The method according to claim 1 wherein said mask is a reticle having has an area-coverage of metal between about 20-25%.

3. The method according to claim 1 wherein said mask is a photoresist pattern having a mesh pattern so that said photoresist pattern has a photoresist area-coverage between about 20-25%.

4. The method according to claim 1 wherein said ion bombardment technique includes using $Ar^+$ ion bombardment.

5. A light-emitting diode constructed according to a method of forming a light-emitting diode as defined in claim 1, comprising:
a semiconductor substrate;
an active layer formed on said semiconductor substrate;
a metal mesh layer formed on said active layer, an area coverage of metal of said metal mesh layer being about 20 to 25% and having myriad pits formed thereinto an exposed portion of said active layer.

6. The light-emitting diode according to claim 5 further comprising a pad formed on said metal mesh layer served as an upper electrode.

* * * * *